United States Patent [19]
Natsume

[11] Patent Number: 5,757,031
[45] Date of Patent: May 26, 1998

[54] SEMICONDUCTOR STATIC MEMORY DEVICE HAVING A TFT LOAD

[75] Inventor: Hidetaka Natsume, Tokyo, Japan

[73] Assignee: NEC Corporation, Tokyo, Japan

[21] Appl. No.: 755,777

[22] Filed: Nov. 22, 1996

Related U.S. Application Data

[63] Continuation of Ser. No. 357,241, Dec. 13, 1994, abandoned.

[30] Foreign Application Priority Data

Dec. 17, 1993 [JP] Japan ................................. 5-317984

[51] Int. Cl.$^6$ ................................................ H01L 27/11
[52] U.S. Cl. ............................ 257/67; 257/903; 257/393
[58] Field of Search ............................ 257/67, 903, 393

[56] References Cited

U.S. PATENT DOCUMENTS 5,239,196  8/1993  Ikeda et al. ................................. 257/69

FOREIGN PATENT DOCUMENTS 2295164  12/1990  Japan.

*Primary Examiner*—David B. Hardy
*Attorney, Agent, or Firm*—Whitham, Curtis & Whitham

[57] ABSTRACT

Each memory cell of an SRAM has a structure in which a gate electrode of a drive MOSFET is formed by a first conductive film, a gate electrode of a load TFT is formed by a third conducive layer and a second conductive film does not exist in an area where two gate electrodes overlap with each other. After the second conductive film is subjected to patterning, a first interlayer insulating film is successively removed with the same photolithographic mask. Since the parasitic capacitance at a memory node of the memory cell is increased by thinning the insulating film between the two gate electrodes, the SRAM has an excellent resistance to soft errors.

17 Claims, 14 Drawing Sheets

SEMICONDUCTOR STATIC MEMORY DEVICE HAVING A TFT LOAD

This is a Continuation of application Ser. No. 08/357,241 filed Dec. 13, 1994, abandoned.

BACKGROUND OF THE INVENTION (a) The Field of the Invention

The present invention relates to a semiconductor static memory device having a transistor load and, more particularly, to an SRAM (Static Random Access Memory) comprising a TFT (thin film transistor) as a load element.

(b) Description of Related Arts

In an SRAM, a memory cell is allocated to each intersection of complementary data lines and a word line for selecting memory cells in a memory cell array. The memory cell is composed of two transfer Metal Oxide Semiconductor Field Effect Transistors MOSFETs and a single flip-flop circuit, the flip-flop circuit comprising two cross-coupled inverters and two interconnection lines therefor. Each inverter is comprised of a drive MOSFET, a load element therefor, a ground line and a power supply line. In general, the transfer MOSFETs and the drive MOSFETs are so called bulk N-channel MOSFETs (bulk NMOSFETs) formed in a bulk semiconductor substrate.

In highly integrated SRAMs having a memory capacity of 4 megabits or more, a P-channel thin film transistor formed in an N-type polysilicon film is generally used as a load element for each inverter forming a flip-flop circuit. FIG. 1 shows an equivalent circuit of a typical SRAM memory cell adopting the above-described structure.

Complementary data lines DL1 and DL2 are connected to flip-flop circuits via transfer MOSFETs Qt1 and Qt2 each is formed as a bulk substrate MOSFET. The gates of the transfer MOSFETs Qt1 and Qt2 are connected to a word line WL. The flip-flop circuit is composed of drive MOSFETs Qd1 and Qd2 each formed as a bulk MOSFET, load TFTs Qp1 and Qp2 each for supplying a small current to a memory node N1 or N2 holding a data stored at those memory nodes N1 and N2, a ground line $V_{ss}$, a power supply line $V_{cc}$ and two cross-coupled interconnections.

The line connected to the gate electrode of the load TFT Qp1 has a resistance component R1 while the line connected to the gate electrode of the load TFT Qp2 has a resistance component R2. A parasitic capacitance C1' is formed between the gate electrode of the load TFT Qp1 and the gate electrode of the bulk drive FET Qd2 while a parasitic capacitance C2' is formed between the gate electrode of the load TFT Qp2 and the gate electrode of the bulk drive FET Qd1. Although the other parasitic resistive and capacitive components exist in other parts on lines in the memory cell of FIG. 1, description thereof is omitted here.

The memory cell of the SRAM as described above is activated by latching the word line WL to a high potential. Subsequently, a data implemented by "High" and "Low" levels of the data line DL1 and DL2 is transferred from the data lines DL1 and DL2 to the memory nodes N1 and N2 through the bulk transfer FETs Qt1 and Qt2 to be stored at the memory nodes N1 and N2 or, otherwise, a data implemented by "High" and "Low" levels of the memory nodes N1 and N2 is read out through the data lines DL1 and DL2.

A structure of the conventional SRAM will now be described with reference to drawings together with a manufacturing step thereof. FIG. 2 is a plan view of a memory cell of a typical SRAM as described above while FIG. 3 is a cross-sectional view of the memory cell of FIG. 2. The bulk transfer MOSFETs Qt1 and Qt2 and the bulk drive MOSFETs Qd1 and Qd2 are comprised of active regions 5a, 5b and 5c as well as gate electrodes 8a, 8b and 8c. The active regions 5a, 5b and 5c are isolated by use of a field oxide film 3 formed on a P-well region 2, which was formed on a main surface of an N-type silicon substrate 1, while the gate electrodes 8a, 8b and 8c are formed by patterning a first conductive film 8.

The active region 5a is interconnected with the gate electrode 8b through a contact-hole 7a while the active regions 5b and 5c are interconnected with the gate electrode 8c through the contact-holes 7b and 7c, respectively. Since an N-type dopant is introduced into the conductive film 8 during a thermal diffusion, heavily doped N-type regions 9 are formed in the active regions 5a–5c located just underneath the contact-holes 7a–7c, respectively.

In fabrication, using the gate electrodes 8a–8c and sidewall insulating spacers 11 formed on sidewalls of the gate electrodes 8a–8c as a mask, an N-type dopant is introduced into the active regions 5a–5c at a high concentration. Next, a first stage heat treatment is performed at a high temperature so that heavily doped N-type regions 12a–12g are formed. Among those regions, the region 12e corresponds to memory node N1 as shown in FIG. 1 while the regions 12f and 12g correspond to the memory node N2 as shown in FIG. 1.

The heavily doped N-type regions 9 are electrically connected with the heavily doped N-type regions 12 via a diffused regions formed in the substrate 1. As a result, the gate electrode 8c of the drive MOSFET Qd1 is electrically connected to the heavily doped N-type regions 12f and 12g, i.e., the memory node N2 while the gate electrode 8b of the drive MOSFET Qd2 is electrically connected to the heavily doped N-type region 12e, i.e., the memory node N1. The gate electrodes 8b and 8c serve as the two cross-coupling interconnections in the memory cell.

The ground line $V_{ss}$ is formed by patterning a second conductive film 15. The heavily doped N-type regions 12c and 12d constituting the sources of the drive MOSFETs Qd1 and Qd2 are connected to the conductive film 15a constituting the ground line $V_{ss}$ through contact-holes 14a and 14b, respectively.

The load TFTs Qp1 and Qp2 are constituted by gate electrodes 18a and 18b and conductive films 21a and 21b, respectively. The gate electrodes 18a and 18b are formed by patterning a third conductive film 18 while the conductive film patterns 21a and 21b are formed by patterning a fourth conductive film 21 to form active regions including sources, channels and drains of the load TFTs Qp1 and Qp2. The gate electrode 18a of the load TFT Qp1 is connected to the gate electrode 8c of the drive MOSFET Qd1 through a via-hole 17a while the gate electrode 18b of the load TFT Qp2 is connected to the gate electrode 8b of the drive MOSFET Qd2 through a via-hole 17b.

On the other hand, in the fourth conductive film patterns 21a and 21b, a P-type dopant is introduced at a high concentration using a known technology into areas bounded by broken lines 31a, 32a, 31b and 32b as shown in FIG. 2. By a second stage heat treatment performed at a high temperature, heavily doped P-type regions 33a, 34a, 33b and 34b are formed. The heavily doped P-type region 33a constitutes the source regions of the load TFT Qp1 while the heavily doped P-type region 34a constitutes the drain region thereof. The heavily doped P-type region 33b constitutes a source region of the load TFT Qp2 while the heavily doped P-type region 34b constitutes the drain region thereof. The P-type regions 33a and 33b of the load TFT Qp1 also constitute the power supply line $V_{cc}$ of the memory cell. The drain 34a of the load TFT Qp1 is connected to the gate electrode 18b of the load TFT Qp2 through a via-hole 20b while the drain 34b of the load TFT Qp2 is connected to the gate electrode 18a of the load TFT Qp1 through a via-hole 20a.

The complementary data lines DL1 and DL2 are implemented by interconnections 27a and 27b, respectively, formed by patterning a two-layer laminate 27 including a barrier metal film 25 and an aluminum alloy film 26. Those interconnections 27a and 27b are connected to the first heavily doped N-type regions 12a and 12b of the transfer FETs through via-holes 24a and 24b, respectively.

A conventional SRAM having the above-described structure is disclosed in JP-A-90-295164, for example. In the SRAM disclosed in the publication, however, the second conductive film extends almost entirely over the bulk MOS-FETs for a memory cell unlike the structure as described with reference to FIGS. 1 to 3, in which the second conductive film extends over only a portion of the bulk MOS-FETs.

SUMMARY OF THE INVENTION

It is an object of the present invention to provide an improved structure for a memory cell of an SRAM having a large parastic capacitance to obtain a higher resistance to soft errors.

In accordance with the present invention, there is provided a static random access memory comprising:

a semiconductor substrate having a main surface thereof;

a first conductive film, a first interlayer insulating film, a second conductive film, a second interlayer insulating film, a third conductive film, a third interlayer insulating film and a fourth conductive film consecutively formed overlying the main surface and each formed as a pattern;

bulk MOSFETs each having a bulk active region on the main surface and a gate electrode formed as a part of the first conductive film; and thin film MOSFETs each having a gate electrode formed as a part of the third conductive film and a thin film active region as a part of the fourth conductive film, the first conductive film having an extending portion in direct contact with the second interlayer insulating film, the extending portion extending in parallel to the third conductive film.

In an SRAM according to the present invention, it is possible to employ a modified structure in which the first conductive film and the third conductive film are opposed to each other at a predetermined position through the second interlayer insulating film together with a portion of the first interlayer insulating film formed thinner than the remaining portion of the first interlayer insulating film, instead of employing the above-described structure.

Advantages obtained in the SRAM according to the present invention are as follows:

The first conductive film and the third conductive film are opposed to each other through only the second interlayer insulating film or through the second interlayer insulating film together with the first interlayer insulating film formed thinner than the other portion of the first interlayer insulating film at a predetermined position. This structure increases a parastic capacitance between the gate electrode of the bulk MOSFET and the gate electrode of the thin film transistor so that a signal at the gate electrode of the thin film transistor varies slowly even when an α-particle hits a memory cell, thereby avoiding soft errors in the memory cell.

BRIEF DESCRIPTION OF THE DRAWINGS

The above and other objects, features and advantages of the present invention will be more apparent from the following description, taken in conjunction with accompanying drawings in which.

DESCRIPTION OF THE PREFERRED EMBODIMENTS

Before describing embodiments of the present invention, the problems involved in the conventional SRAM as described before will be detailed for the sake of understanding the present invention.

In a conventional SRAM of the type as described above, a write-in operation is performed as described below.

After selecting the word line WL and turning on the transfer MOSFETs Qt1 and Qt2, a "Low" level is written from the data line DL1 to the memory node 1 while a "High" level is written from the data line DL2 to the memory node 2, for example. Immediately after the FETs Qt1 and Qt2 are turned off by stopping a selection of the word line WL, the memory node N2 rising towards the "High" level has not yet reached the $V_{cc}$ level so that a driving current flows through the load TFT Qp2 to the memory node N2, whereby the memory node N2 eventually reaches the $V_{cc}$ level. A similar phenomenon occurs in a case where a "High" level is written to the memory node N1 and a "Low" level to the memory node N2.

Destruction of data stored in a memory cell of an SRAM occurs when a potential "High" level approaches a potential corresponding to a "Low" level due to noise, leakage currents from the memory nodes etc. Since recent SRAMs have increased memory capacities, the area of each memory cell is reduced in size, which makes the parasitic capacitance of the memory nodes smaller accordingly. In such SRAMs, resistance to noise consequently decreases, so that resistance to a "soft error" is an important factor for the SRAM.

A soft error occurs when a signal of a "High" level stored at a memory node is destroyed by a negative charge generated in a substrate due to an incidence of an α-particle in a vicinity of the memory node.

Figure 1:
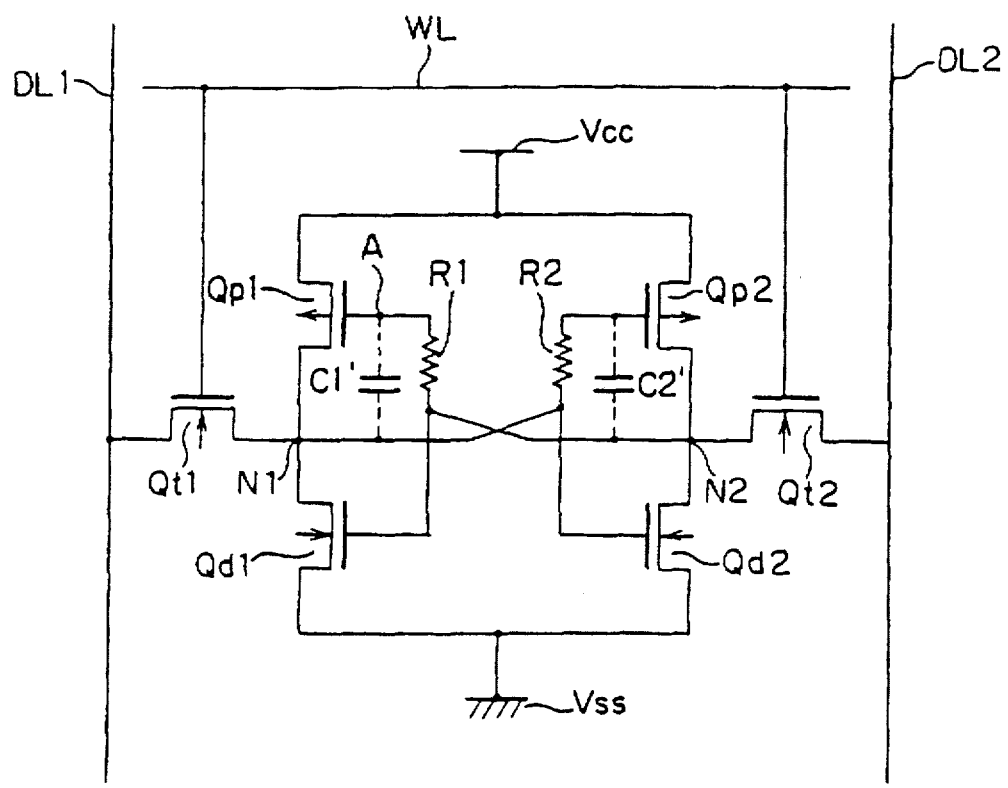
FIG. 1 is an equivalent circuit of a memory cell of a conventional SRAM.
Figure 4:
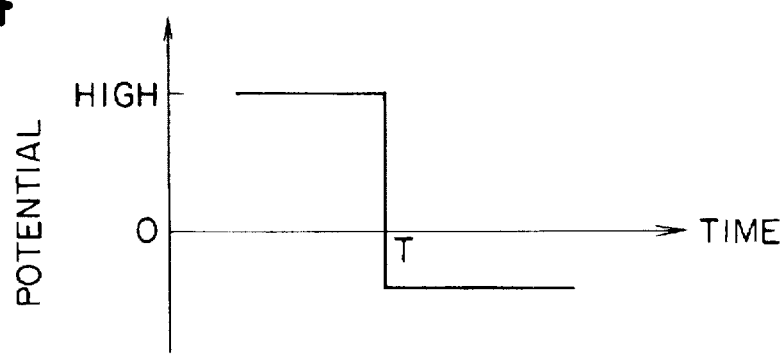
FIG. 4 is a time chart showing the potential of a memory node N2 in FIG. 1 in the memory cell.

In an equivalent circuit of a memory cell of an SRAM shown in FIG. 1, an assumption is made that a signal "High" level is stored in the memory node N2 while a signal "Low" level is stored in the memory node N1. In this condition, the load TFT Qp2 is in an ON-state while the load TFT Qp1 is in an OFF-state. In FIG. 4 which shows the potential of the memory node N2, the potential at the memory node N2 is reversed as shown in the drawing when an incidence of an α-particle to the memory node N2 occurs at a time instant T. If the inversion of the potential is immediately transmitted to a node A shown in FIG. 1, the load TFT Qp1 is immediately turned on so that an ON-current flows through the load TFT Qp1 to the memory node N1, at which a "Low" level is stored, thereby latching the potential at memory node N1 to a "High" level. As a result, the data stored at the memory node is reversed, which means a destruction of information stored in the memory cell.

Figure 5:
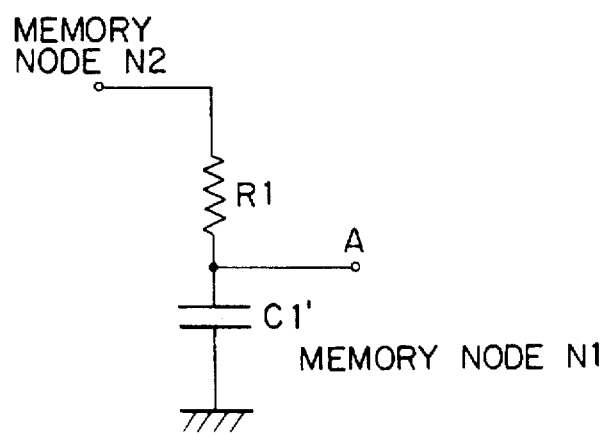
FIG. 5 is a partial equivalent circuit of FIG. 1 used for describing a soft error mechanism in the memory cell.

As shown in FIG. 1, an RC series (filter) circuit composed of a resistor R1 and a capacitor C1' exists between the memory node N2 and the memory node N1 of the memory cell. FIG. 5 shows the filter circuit extracted from the circuit shown in FIG. 1. Due to the effect of the filter circuit shown in FIG. 5, the potential at the node A in FIG. 1, gradually decreases as illustrated by a solid line in FIG. 6 even when the potential at memory node N2 is inversed as shown in FIG. 4. Since the potential at the node A is a gate potential of the TFT Qp1, the TFT Qp1 is not tuned on at once.

If a sufficient ON-current flows through another load TFT Qp2, which is in an ON-state, to memory node N2 before load TFT Qp1 is turned from an OFF-state to an ON-state, the potential at memory node N2 eventually returns to a "High" level so that destruction of data does not occur.

The larger the parasitic capacitance C1' is formed between the gate electrode of the drive MOSFET and the gate electrode of corresponding load TFT, the slower the change rate of the potential at the node A. In detail, if the capacitance C1' can be made larger, the time interval from an incidence of an α-particle to the memory node N2 to turning on of the TFT Qp1 will be longer so that a sufficient charge is supplied through the TFT Qp2 to the memory node N2. Accordingly, the potential at the memory node N2 can eventually return to the "High" level. As a result, destruction of data due to a soft error will not occur, thereby improving resistance to a soft error.

To increase the parasitic capacitance C1', three structures may be considered. A first structure includes a region in which gate electrodes of drive MOSFETs formed by a first conductive film overlapped with the gate electrodes of load TFTs formed by a third conductive film have sufficient area. A second structure includes an interlayer insulating film disposed between the first conductive film and the third conductive film is made of a thinner film. A third structure is such that the material for an interlayer insulating film is replaced by another material having a higher dielectric constant.

However, the first structure is restricted by the layout of the memory cell while the third structure has a risk associated with a new insulating film. The second structure has a drawback in which, if each interlayer insulating film is made thinner, a danger of dielectric breakdown increases. Accordingly, none of those structures can be safely employed.

Now, SRAMs according to embodiments of the present invention will be described with reference to drawings together with a manufacturing process thereof.

Figure 7:
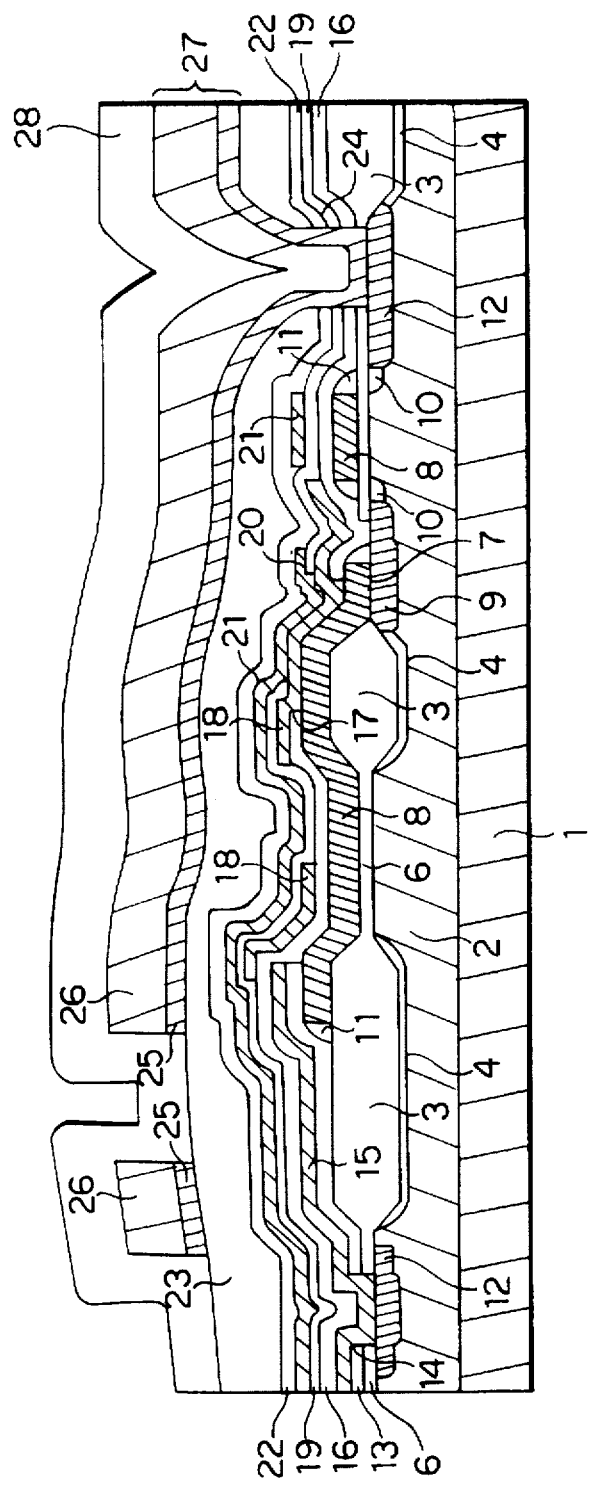
FIG. 7 is a cross-sectional view of the memory cell of an SRAM according to a first embodiment of the present invention.
Figure 8:
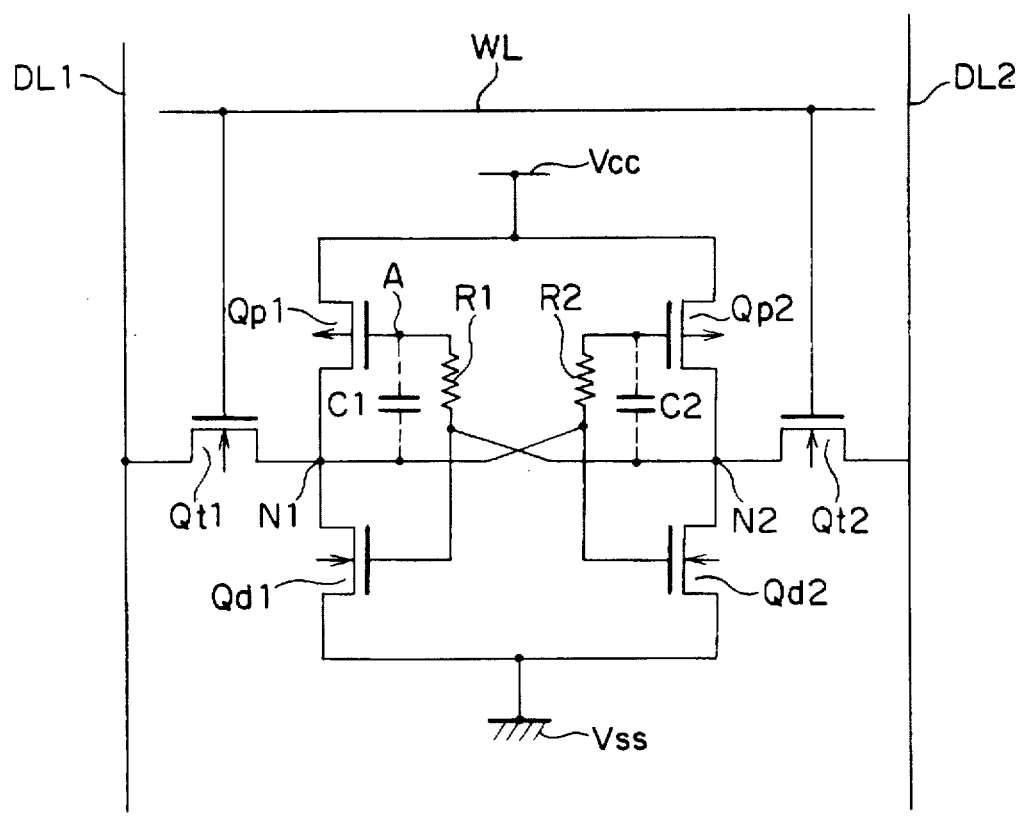
FIG. 8 is an equivalent circuit of the memory cell shown in FIG. 7.

Referring to FIG. 7, there is shown a memory cell in an SRAM according to a first embodiment of the present invention. Since the plan view of this memory cell is same as FIG. 2, FIG. 2 will be referred to as the plan view of FIG. 7 hereinafter. Hence, FIG. 7 shows the cross-sectional view of FIG. 2. Referring to FIG. 8, there is shown an equivalent circuit of the memory cell of the SRAM of FIGS. 2 and 7.

Figure 2:
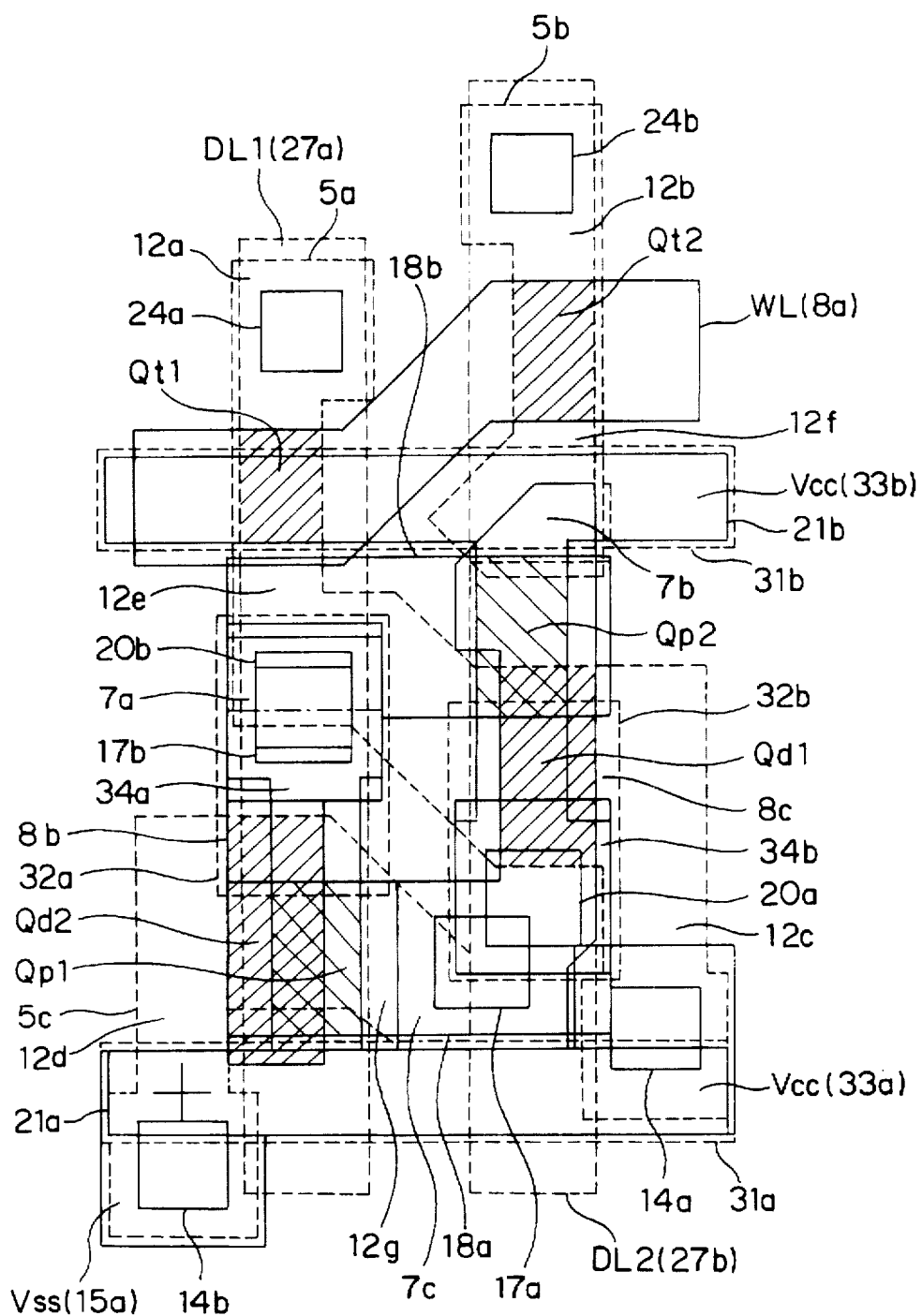
FIG. 2 is a plan view showing the physical structure of the memory cell shown in FIG. 1 as well as a memory cell of an SRAM according to an embodiment of the present invention.

Bulk N-channel transfer MOSFETs (hereinafter referred to as "transfer FETs") Qt1 and Qt2 and bulk N-channel drive MOSFETs (hereinafter referred to as "drive FETs") Qd1 and Qd2 are comprised of active regions 5a, 5b and 5c together with gate electrodes 8a, 8b and 8c as shown in FIG. 2 and FIG. 7. The active regions 5a, 5b and 5c are formed in a P-well region 2 formed by diffusion of a P-type dopant to a main surface of a bulk N-type silicon substrate 1 and are separated by a silicon dioxide film 3 for an electric isolation. The gate electrodes 8a, 8b and 8c are formed by patterning a first conductive film 8.

The gate electrodes of the transfer FETs Qt1 and Qt2 are formed of first-layer conductive film 8a while the gate electrodes of the drive FETs Qd1 and Qd2 are formed of first conductive film 8c and 8b, respectively. A part of a word line WL is constituted by the gate electrode 8a.

In fabrication, using the patterned polysilicon films 8a–8c constituting the gate electrodes of the bulk FETs and sidewall insulating films 11 formed on sidewalls of the gate electrodes 8a–8c as a mask, an N-type dopant is introduced into the active regions 5a–5c at a high concentration.

Subsequently, a first stage heat treatment is performed at a high temperature so that heavily doped N-type regions 12a–12g are formed. The first heavily doped N-type regions of the transfer FETs Qt1 and Qt2 are formed by N-type regions 12a and 12b, respectively. The sources of the drive FETs Qd1 and Qd2 are formed by N-type regions 12c and 12d, respectively. The second heavily doped N-type regions of transfer FET Qt1 and the drain of drive FET Qd1 are formed by N-type region 12e. The second heavily doped N-type region of the transfer FET Qt2 is formed by N-type region 12f while the drain of the drive FET Qd2 is formed by N-type region 12g. N-type region 12e corresponds to the memory node N1 shown in FIG. 5 while N-type regions 12f and 12g correspond to the memory node N2 shown in FIG. 8.

A ground line $V_{ss}$ shown in FIG. 8 is formed by patterning a second conductive film 15. On the heavily doped N-type regions 12c and 12d constituting the sources of the drive FETs Qd1 and Qd2, contact-holes 14a and 14b are formed through which the heavily doped N-type regions 12c and 12d are connected to the ground line $V_{ss}$ 15a so as to maintain the source of the drive FETs Qd1 and Qd2 at the ground potential.

To make the present invention more effective, it is preferable that the patterned ground line $V_{ss}$ 15a is not disposed substantially or occupies only a very small area in each of a region, where the gate electrode 8c of the drive FET Qd1 and the gate electrode of the load TFT Qp2 overlap with each other, and of a region, where the gate electrode 8b of the drive FET Qd2 and the gate electrode of the load TFT Qp1 overlap with each other.

The P-channel load TFTs (hereinafter referred to as "load TFTs") Qp1 and Qp2 shown in FIG. 5 have gate electrodes 18a and 18b formed by patterning a third conductive film 18, and thin film active layers 21a and 21b formed by patterning a fourth conductive film 21 having source, channel and drain regions of the load TFTs. The gate electrode 18a of the load TFT Qp1 is connected to the gate electrode 8c of the drive FET Qd1 through a via-hole 17a while the gate electrode 18b of the load TFT Qp2 is connected to the gate electrode 8b of the drive FET Qd2 through a via-hole 17b.

On the other hand, in the active layers 21a and 21b of the load TFTs, a P-type dopant is introduced at a high concentration using a known technology into areas bounded by broken lines 31a, 32a, 31b and 32b shown in FIG. 2. Heavily doped P-type regions 33a, 34a, 33b and 34b are made by a second stage heat treatment performed at a high temperature. The heavily doped P-type region 33a constitutes the source region of the load TFT Qp1 while the heavily doped P-type region 34a constitutes the drain region thereof. The heavily doped P-type region 33b constitutes the source region of the load TFT Qp2 while the heavily doped P-type region 34b constitutes the drain region thereof. The regions 33a and 33b constitute also a part of a power supply line $V_{cc}$ of the memory cell.

The drain 34a of the load TFT Qp1 is connected to the gate electrode 18b of the load TFT Qp2 through a via-hole 20b while the drain 34b of the load TFT Qp2 is connected to the gate electrode 18a of the load TFT Qp1 through a via-hole 20a.

Complementary data lines DL1 and DL2 are constituted by interconnections 27a and 27b formed by patterning a two-layer laminate 27 including a barrier metal film 25 and an aluminum alloy film 26. Those interconnections 27a and 27b make each electric contact with the first heavily doped N-type regions 12a and 12b of the transfer FETs through via-holes 24a and 24b, respectively.

Figure 10:
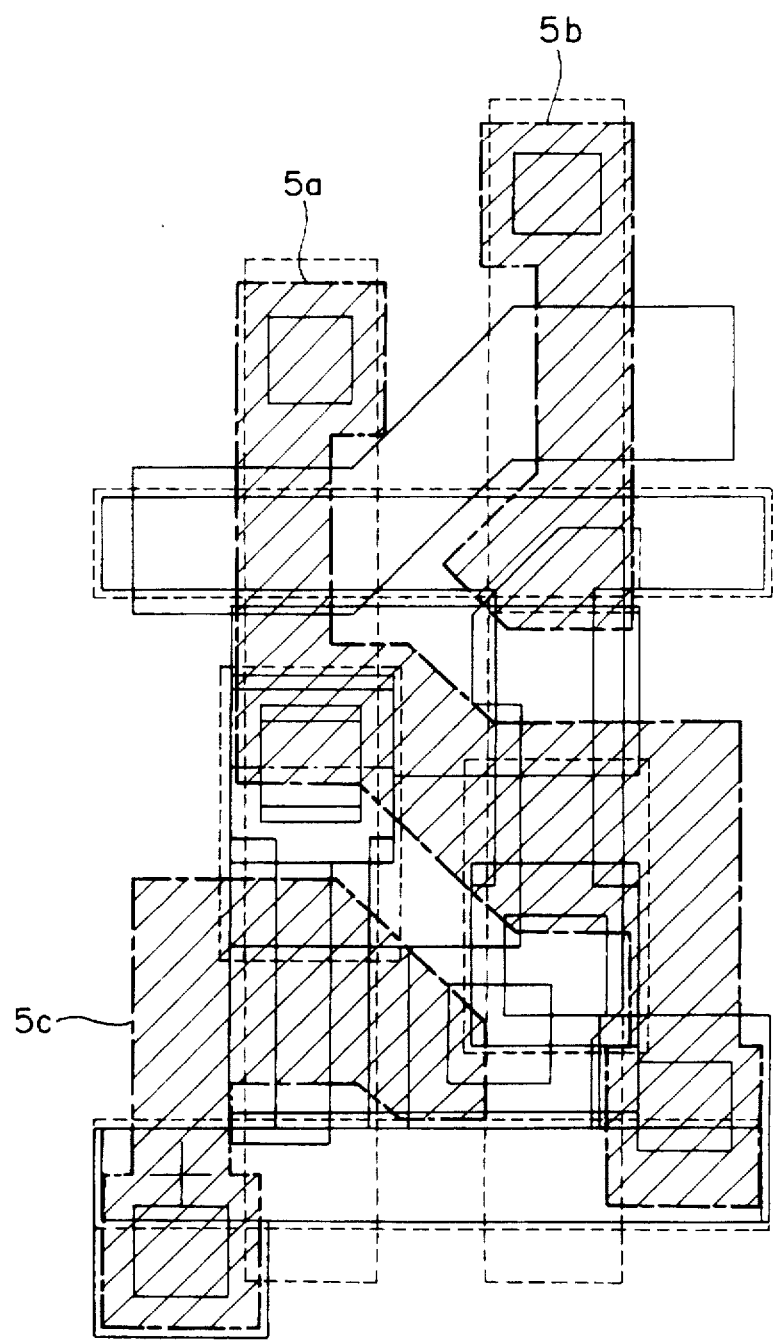
FIG. 10 is a detailed plan view of active regions of drive MOSFETs in the memory cell of FIG. 2.
Figure 11:
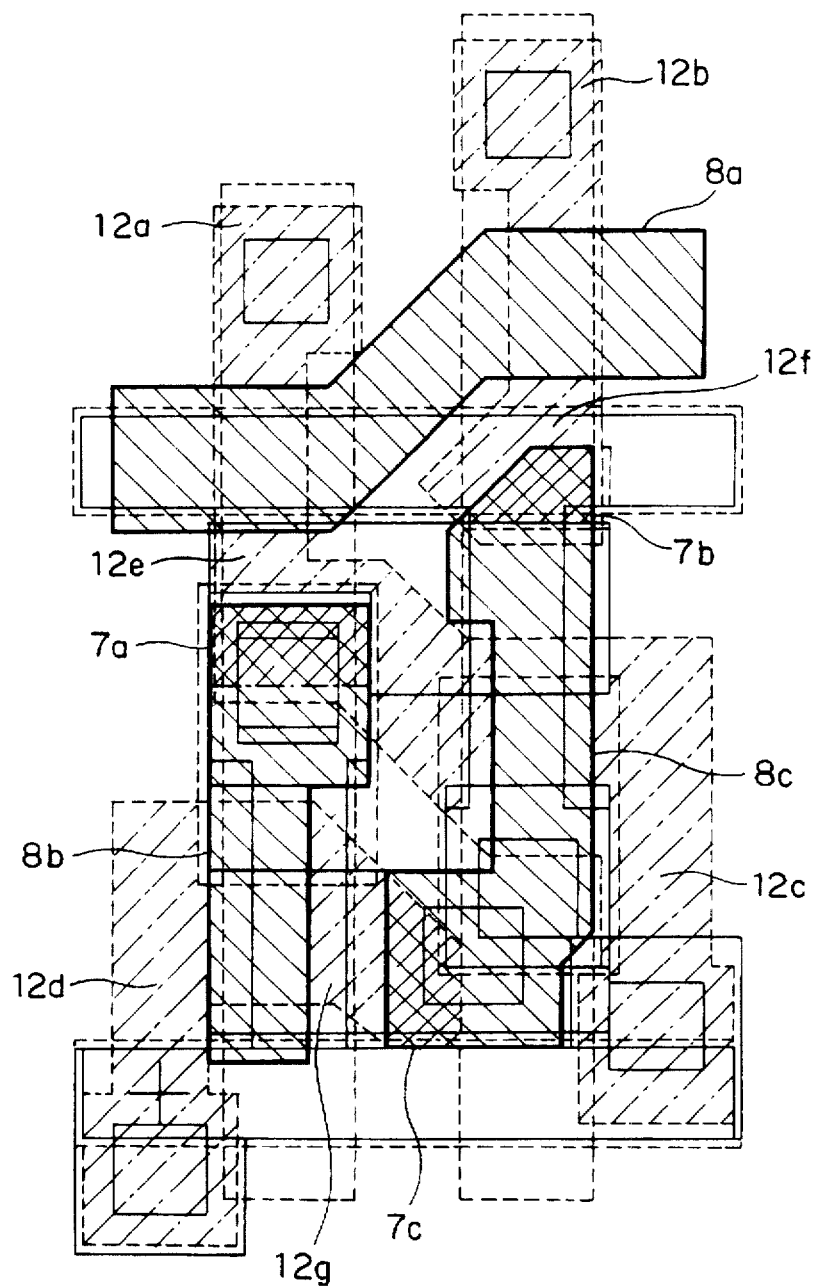
FIG. 11 is a detailed plan view of contact holes, gate electrodes of bulk MOSFETs and heavily doped N-type regions in the memory cell of FIG. 2.
Figure 12:
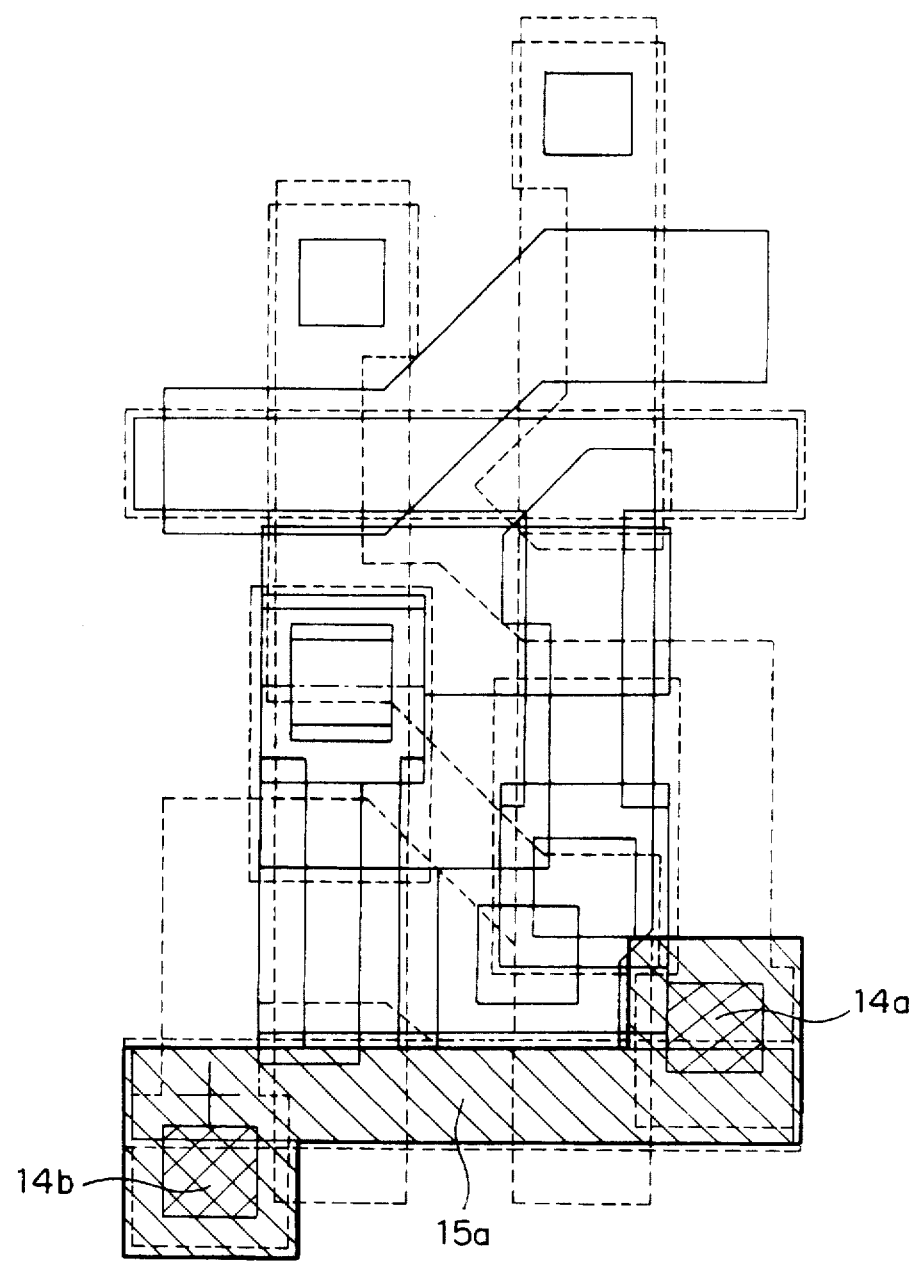
FIG. 12 is a detailed plan view of via-holes and the ground line in the memory cell of FIG. 2.
Figure 13:
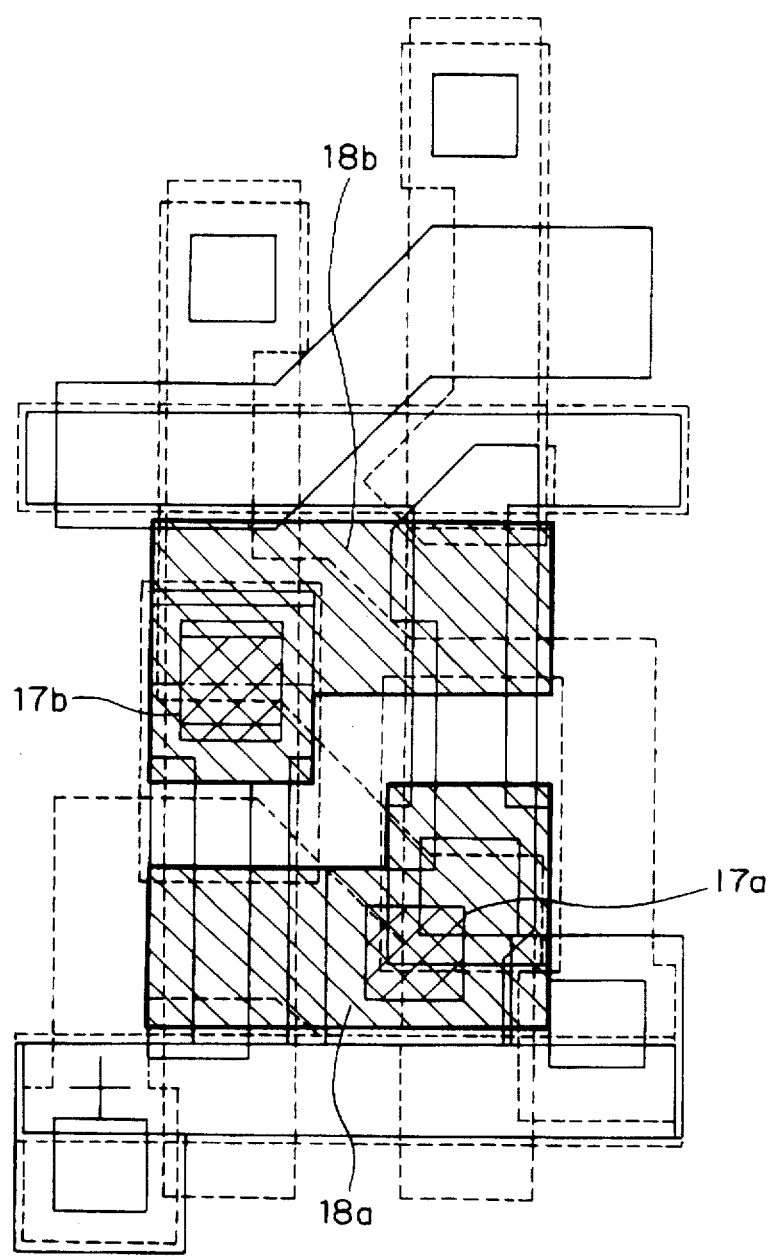
FIG. 13 is a detailed plan view of via-holes and gate electrodes of TFTs in the memory cell of FIG. 2.
Figure 14:
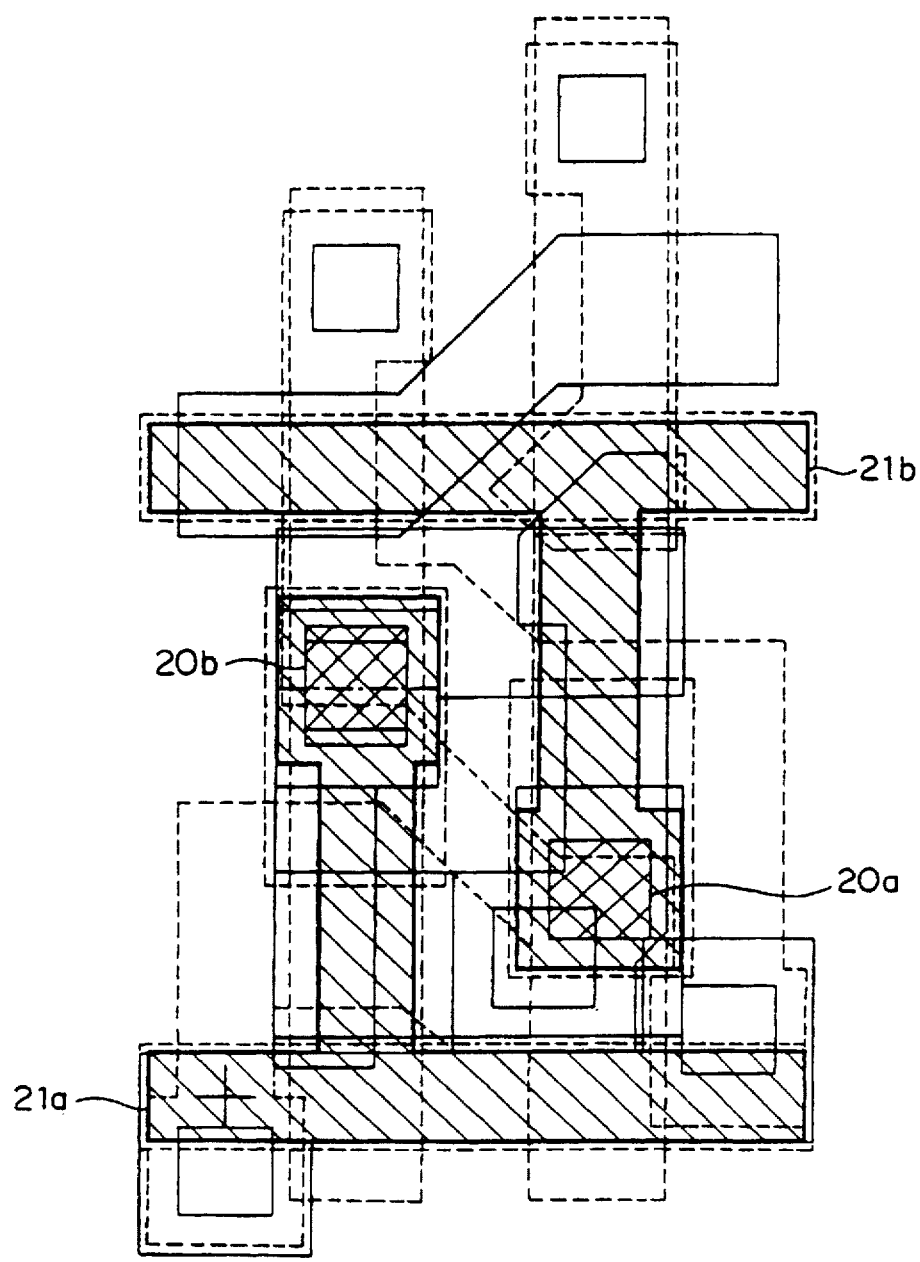
FIG. 14 is a detailed plan view of via-holes, thin film active regions of TFTs in the memory cell of FIG. 2.
Figure 15:
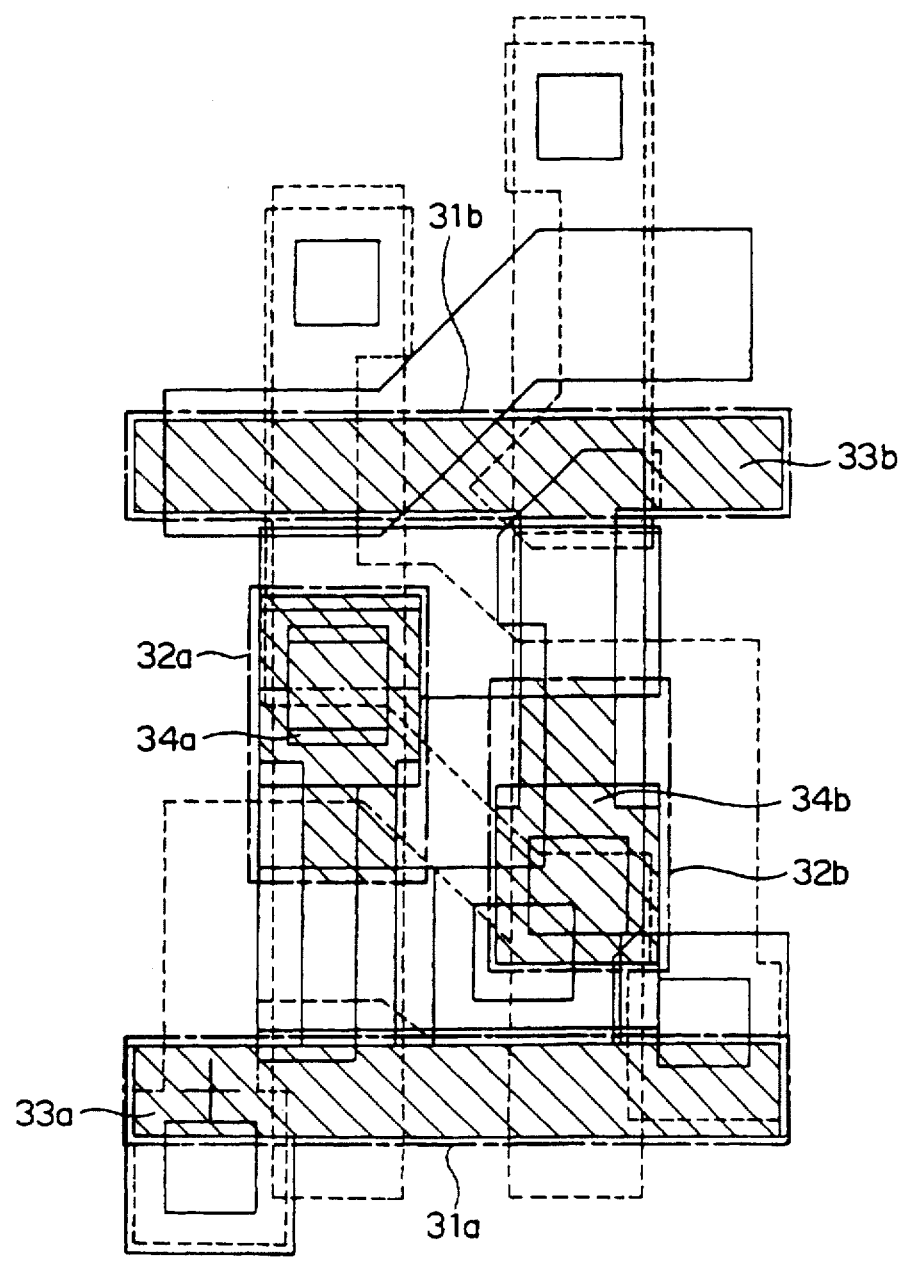
FIG. 15 is a detailed plan view of mask patterns for introducing dopant into the heavily doped P-type regions in the memory cell of FIG. 2.
Figure 16:
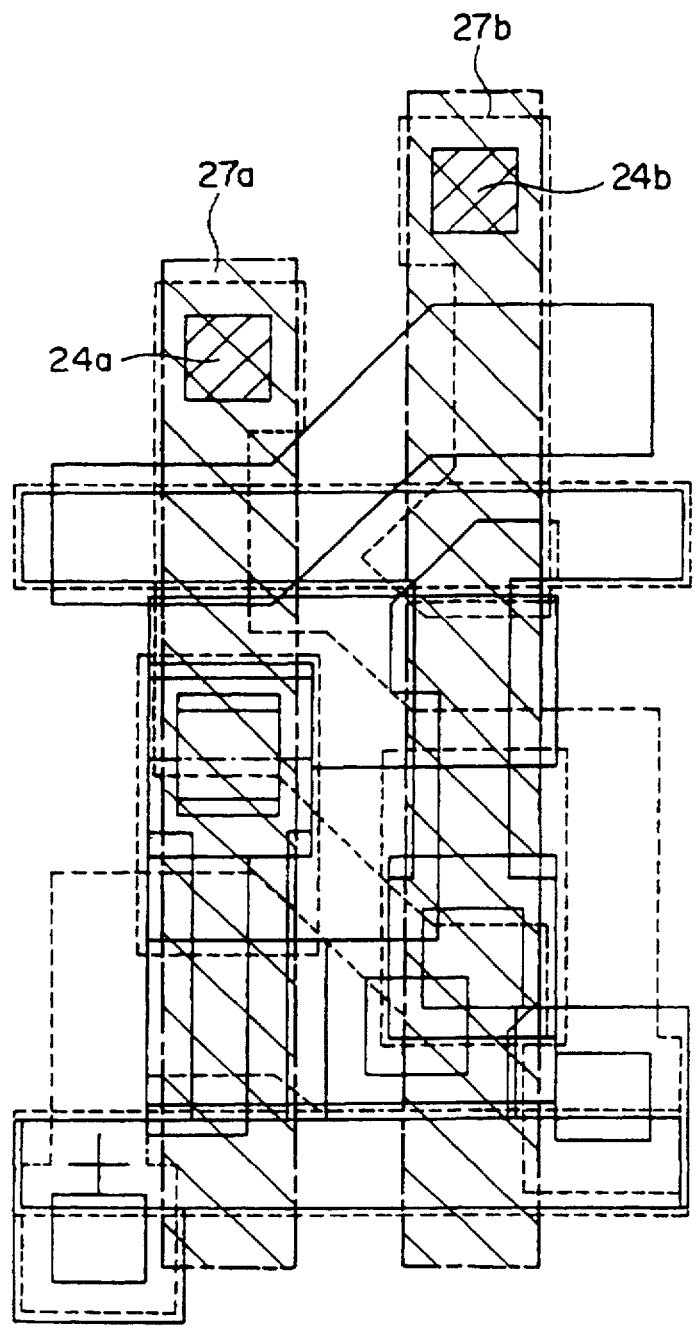
FIG. 16 is a detailed plan view of via-holes and complementary data lines in the memory cell of FIG. 2.

The structure and the manufacturing steps as described in connection with the present embodiment are similar to those of the conventional SRAM. Next, the structure peculiar to the SRAM according to the present invention will be described in detail with reference to FIGS. 7, 8, 9A, 9B and 9C as well as FIGS. 10 to 16. FIGS. 10 to 16 are as follows: FIG. 10 is a detailed plan view of active regions 5a, 5b and 5c of drive MOSFETs in the memory cell; FIG. 11 is a detailed plan view of contact holes 7a, 7b and 7c, gate electrodes 8a, 8b and 8c of bulk MOSFETs and heavily doped N-type regions 12a, 12b, 12c, 12d, 12e, 12f and 12g in the memory cell; FIG. 12 is a detailed plan view of via-holes 14a and 14b and the ground line $V_{ss}$ in the memory cell of FIG. 2; FIG. 13 is a detailed plan view of via-holes 17a and 17b and gate electrodes 18a and 18b of TFTs in the memory cell; FIG. 14 is a detailed plan view of via-holes 20a and 20b and thin film active regions 21a and 21b of TFTs in the memory cell; FIG. 15 is a detailed plan view of mask patterns 31a, 31b, 32a and 32b for introducing dopant into the heavily doped P-type regions 33a, 33b, 34a and 34b in the memory cell of FIG. 2; and FIG. 16 is a detailed plan view of via-holes 24a and 24b and complementary data lines 27a and 27b in the memory cell.

It should be noted that CMOS circuits constituting peripheral circuits of a memory device can be manufactured by using the method as described below in combination with a conventional technology as described before. Although memory cells of the SRAM according to the present embodiment are formed on a single well given on a main surface of a bulk N-type silicon substrate, the memory cells may be also formed on a twin well provided on a main surface of a P-type silicon substrate, for example.

First, the P-well 2 having an impurity concentration of about 1E18–1E19 atoms/cm$^3$ and a depth of about 2–3 µm is formed on the main surface of an N-type silicon substrate 1 by a known technology. Subsequently, the field oxide film 3 made of a silicon dioxide film for electric isolation is formed by a local oxidation of silicon wafer which follows a formation of a channel stop layer 4 constituting an underlying P-type impurity-diffused layer. It is preferred that the field oxide film 3 has a thickness of about 300–500 nm.

Secondly, a dopant is introduced into active regions isolated by the field oxide film 3 to control the threshold voltages of the bulk MOSFETs. As to a dopant for controlling threshold voltage, boron ions, for example, are introduced as acceptors into channel regions by photolithography and an ion-implantation technology with an acceleration energy of about 30 KeV and a dosage of about 1E12 atoms/cm$^2$.

Subsequently, a silicon dioxide film 6 which is to be patterned to form a gate insulating film of the bulk MOSFET is formed covering the main surface of the bulk silicon substrate. The gate insulating film 6 is formed by a thermal oxidation in a thickness of about 10–15 nm. The oxide film 6 constitutes the gate insulating film of the bulk transfer MOSFETs Qt1 and Qt2 as well as the gate insulating film of the bulk drive FETs Qd1 and Qd2.

Here, the P-well 2 may be formed after forming the field oxide film 3 using any technologies, for instance, a MeV-accelerated ion-implantation. At that time, the same mask as that which is formed by photolithography for introducing a dopant for controlling the threshold voltage of the bulk MOSFETs may also be used to introduce a P-type dopant for forming the P-well region 2.

Next, contact-holes 7 are formed in the gate insulating film 6 by photolithographic and wet etching technologies. Subsequently, the gate electrodes of the bulk MOSFETs are formed. In detail, a polysilicon film 8 having a thickness of about 200 nm is first deposited as a first-layer conductive film covering the main surface of the silicon substrate by LP-CVD (Low Pressure Chemical Vapor Deposition) technology for gate electrodes of bulk MOSFETs. An N-type dopant such as phosphorus is then introduced into the polysilicon film 8 by a thermal diffusion. Then, the polysilicon film 8 is patterned by photolithography and dry etching to obtain polysilicon patterns 8a, 8b and 8c having designed shapes. The polysilicon pattern 8a constitutes the gate electrodes of the transfer FETs Qt1 and Qt2, the polysilicon pattern 8c constitutes the gate electrode of the drive FET Qd1 and the polysilicon pattern 8b constitutes the gate electrode of the drive FET Qd2. The polysilicon pattern 8a also forms a part of a word line WL.

Contact-holes 7 are formed through which the gate electrodes of the drive FETs Qd1 and Qd2 are connected to the active regions. Namely, a contact-hole 7a is formed in the gate oxide film 6 at a portion located on the active region 5a. Similarly, a contact-hole 7b is located on the active region 5b and a contact-hole 7c is located on the active region 5c. The polysilicon pattern 8b constituting the gate electrode of the drive FET Qd2 interconnects through the contact-hole 7a to the active region 5a while the polysilicon pattern 8c constituting the gate electrode of the drive FET Qd1 is connected through the contact-holes 7b and 7c to the active regions 5b and 5c, respectively. Since an N-type dopant introduced into the polysilicon film 8 by a thermal diffusion is again introduced into the active regions just underneath the contact-holes 7 by an impurity diffusion, heavily doped N-type regions 9 are formed.

The introduction of the N-type dopant into the polysilicon film 8 can be performed either by an ion-implantation technology or by an in-situ doping in which the N-type dopant is introduced during deposition to form a doped polysilicon film. It is preferred that the polysilicon film 8 is comprised of a low resistive material to reduce a signal delay induced by the resistance of the word line. As an actual example, it is preferable to use a composite film composed of a silicide formed by silicon together with a refractory metal such as tungsten or titanium and of a heavily doped polysilicon, so called a polycide structure.

Subsequently, an N-type dopant such as phosphorous is introduced into the active regions 5a–5c using the gate electrodes 8a–8c as a mask by an ion-implantation processing with an acceleration energy of about 40 KeV and a dosage of about 1E13 atoms/cm$^2$. Lightly doped N-type regions 10 are formed by a subsequent heat treatment performed at a high temperature.

Then, a silicon dioxide film having a thickness of about 100–200 nm is deposited covering the main surface of the silicon substrate by a LP-CVD technology. Subsequently, the silicon dioxide film thus deposited is etched back by an anisotropic dry etching to form sidewall insulating films 11 serving as spacers on the sidewalls of the gate electrodes 8a–8c. Using the gate electrodes 8a–8c and the sidewall spacers 11 as a mask, an N-type dopant such as arsenic is introduced into the active regions by an ion-implantation technology with an acceleration energy of about 30 KeV and a dosage of about 1E15 atoms/cm$^2$.

A first-stage heat treatment is then carried out at a high temperature of 800°–900° C. for 10–15 minutes in a nitrogen atmosphere so that both lightly doped N-type regions 10 and heavily doped N-type regions 12 having a thickness of about 0.1–0.3 µm are formed in the active regions.

After the steps as described above, the sources and drains of the bulk MOSFETs Qt1, Qt2, Qd1 and Qd2 are constituted by both of the lightly doped N-type regions 10 and the heavily doped N-type regions 12, respectively. Accordingly, the MOSFETs Qt1, Qt2, Qd1 and Qd2 have a so called LDD structure.

Furthermore, the heavily doped N-type regions 9 and the heavily doped N-type regions 12 are electrically connected with each other through a diffusion layer in the substrate. As a result, the polysilicon pattern 8c constituting the gate electrode of the drive FET Qd1 is electrically connected to the heavily doped N-type regions 12f and 12g via the contact-holes 7b, 7c and the heavily doped N-type regions 9 while the polysilicon pattern 8b constituting the gate electrode of the drive FET Qd2 is electrically connected to the heavily doped N-type region 12e through the contact-hole 7a and the heavily doped N-type region 9.

Next, a silicon dioxide film 13 having a thickness of about 100 nm is deposited as a first interlayer insulating film covering the main surface of the silicon substrate by LP-CVD. Subsequently, via-holes 14 are formed in the silicon dioxide film 13 by photolithography and dry etching.

Then, a ground line $V_{ss}$ is formed. In detail, a polysilicon film 15 having a thickness of about 100 nm is first formed as a second-layer conductive film covering the main surface of the silicon substrate by LP-CVD. Subsequently, an N-type dopant such as arsenic is introduced into the polysilicon film 15 by an ion-implantation technology with an acceleration energy of about 20 KeV and a dosage of about 1E16 atoms/cm$^2$ to reduce the resistivity of the polysilicon film 15. The polysilicon film 15 is then patterned to form the ground line $V_{ss}$ 15a by photolithography and dry etching which can remove substantially only polysilicon films.

Subsequently, using the same mask as that used for patterning the polysilicon film 15, the silicon dioxide film 13 is patterned by a dry etching technology which can remove substantially only silicon dioxide films. As a result, the dioxide film 13 is substantially completely removed except for an area adjacently to the ground line $V_{ss}$ 15a as viewed in FIG. 2.

The sources of the drive FETs Qd1 and Qd2 are connected to the ground line $V_{ss}$ through via-holes 14 to maintain the source regions at the ground potential. In detail, a via-hole 14a is located in the heavily doped N-type region 12c constituting the source of the drive FET Qd1 while via-hole 14b is located in the heavily doped N-type region 12d constituting the source of the drive FET Qd2. Those regions 12c and 12d are connected to the ground line $V_{ss}$ 15a through via-holes 14a and 14b, respectively.

It is preferred that the polysilicon film 15 is made of a material having a small resistivity to reduce interconnection resistance of the ground line $V_{ss}$. As an actual example, it is preferred to use a polycide structure in which a composite film composed of a heavily doped polysilicon film and of a silicide film including a refractory metal such as tungsten or titanium and silicon.

A silicon dioxide film 16 having a thickness of about 100 nm is deposited as a second interlayer insulating film covering the main surface of the silicon substrate by LP-CVD. As a result, the gate electrodes of the load TFTs, which are to be described below, are electrically insulated from the ground line by the silicon dioxide film 16.

Figure 3:
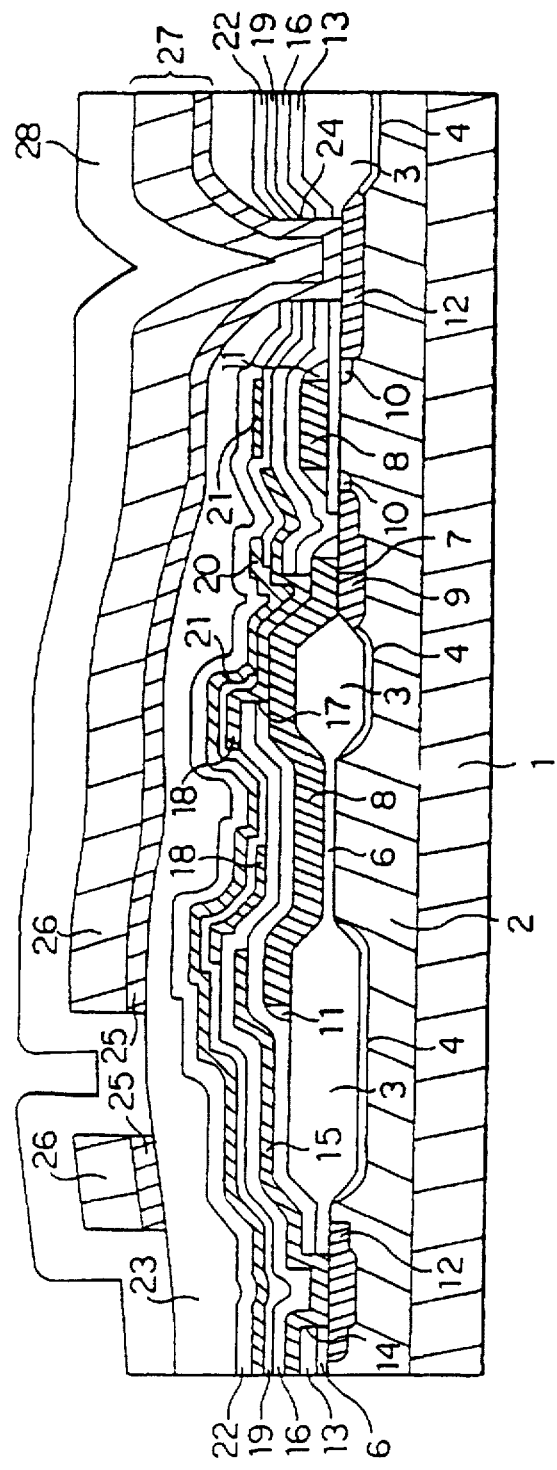
FIG. 3 is a cross-sectional view of the memory cell shown in FIG. 2.

In the conventional SRAM, the gate electrodes of the load TFTs and the gate electrodes of the bulk MOSFETs are isolated from each other by a laminate including the silicon dioxide film 13 and the silicon dioxide film 16, i.e., a laminate composed of the first and second interlayer insulating films as shown in FIG. 3. In contrast thereto, with the SRAM according to the present embodiment, the gate electrodes of the load TFTs and the gate electrodes of the bulk MOSFETs are isolated from each other by the single silicon dioxide film 16, i.e., only by the second interlayer insulating film as shown in FIG. 7.

Via-holes 17 are formed in the silicon dioxide film 16 by photolithography and dry etching technology. The gate electrodes of the load TFTs are then formed. In detail, a polysilicon film 18 having a thickness of about 100 nm is deposited as a third conductive layer covering the main surface of the silicon substrate by LP-CVD. Subsequently, an N-type dopant such as phosphorous is introduced into the polysilicon film 18 by an ion-implantation technology with an acceleration energy of about 20 KeV and a dosage of about 1E13-1E15 atoms/cm$^2$ to reduce a resistivity of the poly-silicon film 18.

Subsequently, the polysilicon film 18 is patterned to obtain polysilicon patterns 18a and 18b. The polysilicon pattern 18a constitutes the gate electrode of the load TFT Qp1 while the polysilicon pattern 18b constitutes the gate electrode of load TFT Qp2.

The doping of the polysilicon film 18 using a P-type dopant such as boron is performed by an ion-implantation technology. For example, boron ions are implanted into the polysilicon film 18 with an acceleration energy of about 15 KeV and a dosage of about 1E13-1E15 atoms/cm². The P-channel load TFTs will have N-gate electrodes if an N-type dopant is introduced into gate electrodes while the TFTs will have P-gate electrodes if a P-type dopant is introduced.

The via-holes 17 serve for interconnections between the the gate electrodes of the load TFTs Qp1 and Qp2 and the gate electrodes of the drive FETs Qd1 and Qd2. In detail, via-hole 17a is formed on the gate electrode 8c of the drive FET Qd1 while via-hole 17b is formed on the gate electrode 8b of the drive FET Qd2. The polysilicon pattern 18a constituting the gate electrode of load TFT Qp1 is connected to the gate electrode 8c of the drive FET Qd1 through the via-hole 17a while the polysilicon pattern 18b constituting the gate electrode of the load TFT Qp2 is connected to the gate electrode 8b of the drive FET Qd2 through the via-hole 17b.

A silicon dioxide film 19, which is to be patterned to form the gate insulating films of the load TFTs, is formed covering the main surface of the silicon substrate by LPCVD to have a thickness of about 20–50 nm. The oxide film 19 constitutes the gate insulating films of the load TFTs Qp1 and Qp2. After that, via-holes 20 are formed in the gate insulating film 19 by photolithography and etching.

Next, sources, channels and drains of the load TFT and a power supply line $V_{cc}$ are to be formed. A silicon film 21 having a thickness of about 50 nm is first deposited as a fourth conductive film covering the main surface of the silicon substrate. In detail, an amorphous silicon film is deposited by using $Si_2H_6$ as a source gas, which is followed by an annealing step for 3 to 12 hours at a temperature of about 600° C. in a nitrogen atmosphere for crystallization.

Subsequently, a dopant is introduced into the polycrystalized silicon film 21 to control threshold voltages of the load TFTs. For example, phosphorous ions are introduced into the polycrystallized silicon film 21 as an N-type dopant by using an ion-implantation technology with an acceleration energy of about 20 KeV and a dosage of about 1E12 atoms/cm². Subsequently, the polycrystallized silicon film 21 is patterned by photolithography and dry etching to obtain polysilicon patterns 21a and 21b. The polysilicon pattern 21a constitutes a thin film active layer serving as a source, a channel and a drain of load TFT Qp1 and a part of the ground line $V_{cc}$ while the polysilicon pattern 21b constitutes a thin film active layer serving as a source, a channel and a drain of the load TFT Qp2 and a part of the ground line $V_{cc}$.

A P-type dopant is introduced at a high concentration into portions of the polycrystallized silicon patterns 21a and 21b which are to be formed as sources and drains of the load TFTs and a part of the ground line $V_{cc}$. A mask for introducing a dopant is patterned by photolithography to form configurations illustrated in broken lines 31a, 31b, 32a and 32b as shown in FIG. 2. A P-type dopant such as $BF_2$ is then introduced by an ion-implantation technology with an acceleration energy of about 40 KeV and a dosage of about 1E15 atoms/cm². As a result, heavily doped P-type regions 33a, 33b, 34a and 34b are to be formed by a subsequent heat treatment performed at a high temperature.

The heavily doped P-type regions 33a, 33b, 34a and 34d constitute source and drain regions of the load TFTs Qp1 and Qp2 and a part of the source line $V_{cc}$. Namely, the heavily doped P-type region 33a where the polycrystallized amorphous layer 21a and the area 31a are overlapped with each other constitutes a source of the load TFT Qp1 while the heavily doped P-type region 34a where the polycrystalized amorphous layer 21a and the area 32a are overlapped with each other constitutes the drain of the load TFT Qp1. Similarly, the heavily doped P-type region 33b where the polycrystallized amorphous layer 21b and the area 31b are overlapped with each other constitutes a source of the load TFT Qp2 while the heavily doped P-type region 34b where the polycrystallized amorphous layer 21b and the area 32b are overlapped with each other constitutes the drain of the load TFT Qp2. Each of the heavily doped P-type regions 33a and 33b constitutes a part of the source line $V_{cc}$.

The via-holes 20 serve for interconnections between the drains of the load TFTs Qp1 and Qp2 and the gate electrodes of the load TFTs Qp2 and Qp1, respectively. Namely, the via-hole 20b is located on the gate electrode 18b of load TFT Qp2 while the via-hole 20a is located on the gate electrode 18a of load TFT Qp1. The drain 34a of the load TFT Qp1 is interconnected with the gate electrode 18b through the via-hole 20b while the drain 34b of the load TFT Qp2 is interconnected with the gate electrode 18a through the via-hole 20a.

A silicon dioxide film 22 having a thickness of about 100 nm is deposited as a third-layer interlayer insulating film covering the main surface of the silicon substrate by LP-CVD. Subsequently, a planarization step is performed. In detail, a BPSG film 23 having a thickness of about 300 nm is deposited covering the main surface of the silicon substrate by LP-CVD which is followed by a second-stage heat treatment performed at a high temperature of about 800°–900° C. for 10 to 30 minutes in a nitrogen atmosphere to reduce a step height by a reflow of the BPSG film. At the same time, the heavily doped P-type regions 33a, 33b, 34a and 34b are formed by the heat treatment. Here, the silicon dioxide film 22 is formed to prevent such dopants as boron and phosphorous included in the BPSG film 23 from diffusing into lower layers. Via-holes 24 are formed in the silicon dioxide film 23 by photolithography, wet etching and dry etching.

The complementary data lines DL1 and DL2 are formed. In detail, a two-layer laminate 27 is first formed by successively depositing a barrier metal film 25 and an aluminum alloy film 26 covering the main surface of the silicon substrate. The barrier metal 25 constituting a lower layer of the laminate 27 is formed by a PVD (Physical Vapor Deposition) technology of a refractory metal such as titanium to a thickness of about 100–200 nm. The aluminum alloy layer 26 constituting an upper layer of the laminate 27 is formed by a PVD technology of an Al—Cu—Si alloy to a thickness of about 600–800 nm.

After that, the two-layer laminate 27 is patterned into laminate patterns 27a and 27b by using photolithography and dry etching. The laminate pattern 27a constitutes the data line DL1 while the laminate pattern 27b constitutes the data line DL2.

Finally, a passivation film 28 is deposited to obtain a memory cell having a final structure as shown in FIG. 7.

Now, advantages of the present invention will be described while comparing the structure of the memory cell according to the embodiment with the structure of the conventional memory cell with reference to FIGS. 9A and 9B.

Figure 9A:
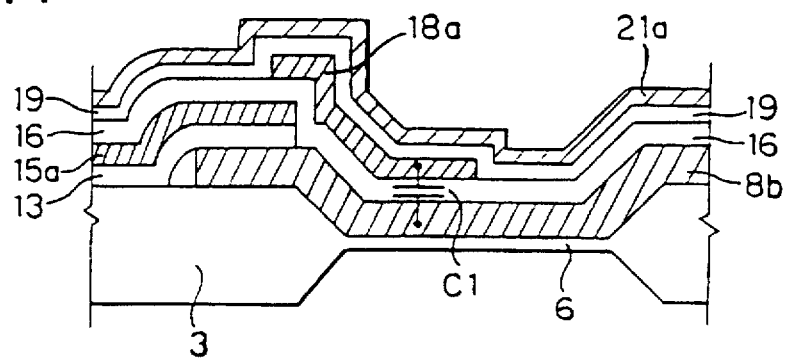
FIGS. 9A, 9B and 9C are partial cross-sectional views of memory cells of the first embodiment, a conventional memory cell and a second embodiment, respectively.
Figure 9B:
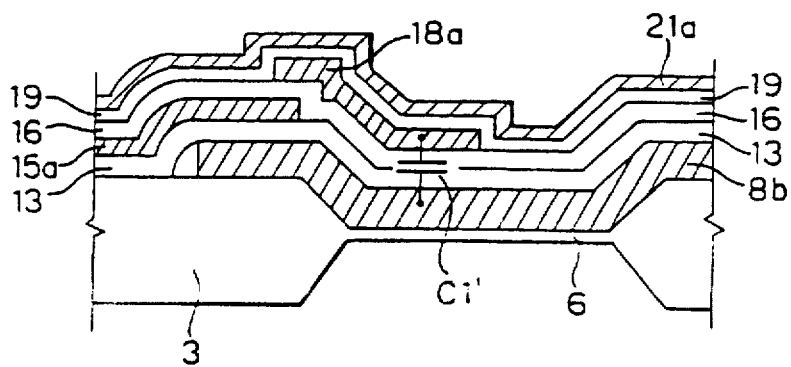

FIG. 9A is an enlarged partial view of the memory cell shown in FIG. 7 while FIG. 9B is an enlarged partial view of the memory cell shown in FIG. 3.

As described above, the silicon dioxide film 13 is not removed during the patterning of the ground line $V_{ss}$ 15a in the conventional memory cell. On the contrary, the silicon dioxide film 13 is removed in the embodiment as described above during the patterning for the ground line $V_{ss}$ 15a except for an area adjacent to the ground line $V_{ss}$ 15a shown in FIG. 2. Accordingly, in the conventional memory cell shown in FIG. 9B, the gate electrode 8b of the drive FET Qd2 is insulated from the gate electrode 18a of the load TFT Qp1 by the silicon dioxide films 13 and 16 whereas in the memory cell according to the present embodiment, the gate electrode 8b of the drive FET Qd2 is insulated from the gate electrode 18a of the load TFT Qp1 by a single interlayer insulating film, i.e., the silicon dioxide film 16.

In both cases, a parasitic capacitance is formed between two gate electrodes 8b and 18a. However, the insulating film producing a capacitance C1 in the memory cell of the present embodiment shown in FIG. 9A is thinner than the insulating film producing a capacitance C1' in the conventional memory cell shown in FIG. 9B. Therefore, the capacitance C1 is larger than the capacitance C1'.

Figure 6:
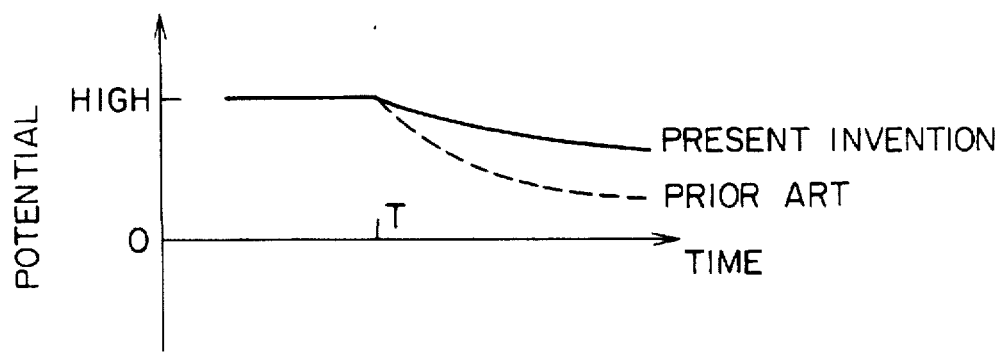
FIG. 6 is a graph showing a time chart of a signal level at a gate electrode of a thin film transistor for a comparison of the conventional SRAM with the SRAM according to the present invention.

A potential corresponding to a "High" level of the node A is lowered at a relatively high speed in a conventional memory cell along a dotted curve as shown in FIG. 6 when an α-particle hits the first memory node N2 in which a data of the "High" level is stored, while the speed of potential shift at node A is lowered along a solid curve in FIG. 6 according to the present invention because the parasitic capacitance C1 is larger than the capacitance C1' in the conventional memory. Hence, the load TFT Qp1 supplies a load current to the second memory node N2 for a longer period.

If a sufficient current is supplied through the TFT Qp2 in an ON-state to the memory node N2 before the TFT Qp1 is turned on, the potential at the memory node N2 can be returned to a normal "High" level. In the memory cell of the present embodiment, the TFT Qp1 will not turn on due to the supply current through the TFT QP2 in contrast to the conventional memory cell, thereby avoiding destruction of data.

In detail, the data stored at the memory node N2 returns to a "High" level due to a long period of ON-current of TFT Qp2 with a probability higher than that in the conventional memory cell before the TFT Qp1 turns on. In other words, in the memory cell according to the present embodiment, the stored data destruction occurs at a smaller rate than that in the conventional memory cell. As a result, the SRAM according to the present embodiment has a higher resistance to soft errors as compared with the conventional SRAM.

In the SRAM according to the above embodiment, the resistance to soft errors can be increased by adding a very simple process to the conventional method, i.e., the removal of the first interlayer insulating film during the patterning of the second conductive film formed on the first interlayer insulating film.

Figure 9C:
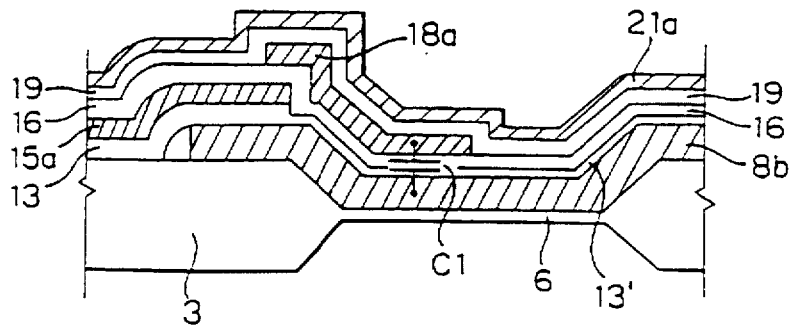

Now, an SRAM according to a second embodiment of the present invention is to be described with reference to FIG. 9C. In the first embodiment, the second conductive film 15a and the first interlayer insulating 13 film adjacent to the second conductive film 15a are patterned sequentially by both of a dry etching step for removing a polysilicon film and a second dry etching step for removing a silicon dioxide film. In the second embodiment, however, a dry etching step for removing a polysilicon film is employed in which an etch selectivity of a polysilicon film to a silicon dioxide film is lowered by controlling etching conditions. In detail, when the polysilicon film constituting the second-layer conductive film is patterned, the etch step is continued to remove successively the lower layer, i.e., the silicon dioxide film to leave a thin oxide film 13' after the polysilicon film has been substantially etched.

In the second embodiment, however, there is a possibility to damage the first conductive film disposed beneath the fist interlayer insulating film if the lower layer, i.e., the first interlayer insulating film is substantially completely removed by the continued etching. Accordingly, it is not preferable to completely remove the first interlayer insulating film. Therefore, an amount of increase in the capacitance is smaller than that in the memory cell according to the first embodiment. However, it is not necessary in the second embodiment to use two different kinds of dry etching conditions during the patterning which is a primary step of the manufacturing process for the SRAM of the present invention because most of the first interlayer insulating film can be removed by a single dry etching step. Therefore, the manufacturing process for the memory cell according to the embodiment can be simplified.

In the memory cell of the SRAM according to the present embodiment, the first interlayer insulating film is successively removed with the same photolithographic mask after the second conductive film has been patterned using a photolithographic mask. Hence, the insulating film between the first conductive film and the third conductive film can be made thinner without causing any dielectric breakdown, whereby the parasitic capacitance formed between the first and third conductive films can be increased. Accordingly, SRAMs having a highest resistance to soft errors can be obtained.

Although the present invention is described with reference to the preferred embodiments, the present invention is not limited to such embodiments and it will be obvious for those skilled in the art that various modifications or alterations can be easily made based on the above embodiments within the scope of the present invention.

What is claimed is:

1. A static random access memory, comprising:

a semiconductor substrate having a main surface;

a first conductive film, a first interlayer insulating film, a second conductive film, a second interlayer insulating film, a third conductive film, a third interlayer insulating film and a fourth conductive film consecutively formed overlying the main surface and each formed as a pattern;

bulk Metal Oxide Semiconductor Field Effect transistors (MOSFETs) each having a bulk active region on said main surface and a gate electrode comprising a portion of said first conductive film; and thin film MOSFETs each having a gate electrode comprising a portion of said third conductive film and a thin film active region comprising a portion of said fourth conductive film, said first conductive film having a first portion extending parallel to said third conductive film, said first portion and said third conductive film being separated only by said second interlayer insulating film, wherein said second interlayer insulating film has a thickness similar to that of said third conductive film.

2. A static random access memory as defined in claim 1, wherein each of said thin film MOSFETs comprises a load element for a corresponding one of said bulk MOSFETs.

3. A static random access memory as defined in claim 1, wherein said second conductive film comprises a ground line.

4. A static random access memory as in claim 1, wherein said first interlayer insulating film and said second conductive film are absent between said first portion of said first conductive film and said third conductive film.

5. A static random access memory as in claim 1, wherein said first inter layer insulating film has a substantially uniform first thickness and said second interlayer insulating film has said substantially uniform first thickness wherein said first portion of said first conductive film is separated from said third conductive film by said first thickness.

6. A static random access memory as in claim 1, wherein said second interlayer insulating film has a thickness above approximately 50 nm.

7. A static random access memory as in claim 1, wherein said second interlayer insulating film has a thickness of approximately 100 nm.

8. A static random access memory, comprising:

a semiconductor substrate having a main surface;

a first conductive film, a first interlayer insulating film, a second conductive film, a second interlayer insulating film, a third conductive film, a third interlayer insulating film and a fourth conductive film consecutively formed overlying said main surface and each formed as a pattern;

bulk Metal Oxide Semiconductor Field Effect Transistors (MOSFETs) each having a bulk active region on said main surface and a gate electrode comprising a portion of said first conductive film; and thin film MOSFETs each having a gate electrode comprising a portion of said third conductive film and a thin film active region comprising a portion of said fourth conductive film, said first interlayer insulating film including a first portion having a first thickness and a second portion having a second thickness, wherein said first thickness is less than said second thickness, said first conductive film having a third portion extending parallel to said third conductive film, wherein said third portion and said third conductive film are separated only by said first portion and said second interlayer insulating film and said second interlayer insulating film has a thickness similar to that of said third conductive film.

9. A static random access memory as defined in claim 8, wherein each of said thin film MOSFETs comprises a load element for a corresponding one of said bulk MOSFETs.

10. A static random access memory as defined in claim 8, wherein each of said second conductive film comprises a ground line.

11. A static random access memory as in claim 8, wherein said second conductive film is absent between said third portion of said first conductive film and said third conductive film.

12. A static random access memory as in claim 8, wherein said first interlayer insulating film has a substantially uniform first thickness and said second interlayer insulating film has said substantially uniform first thickness, wherein said third portion of said first conductive film is separated from said third conductive film by said first thickness.

13. A static random access memory comprising:

a semiconductor substrate having a main surface;

a first conductive film, a first interlayer insulating film, a second conductive film, a second interlayer insulating film, a third conductive film, a third interlayer insulating film and a fourth conductive film consecutively formed overlying the main surface and each formed as a pattern;

bulk Metal Oxide Semiconductor Field Effect transistors (MOSFETs) each having a bulk active region on said main surface and a gate electrode comprising a portion of said first conductive film; and thin film MOSFETs each having a gate electrode comprising a portion of said third conductive film and a thin film active region comprising a portion of said fourth conductive film, said second conductive film and said first interlayer insulating film being patterned such that said first interlayer insulating film is removed from substantially all regions other than regions where said second conductive film remains, wherein said second interlayer insulating film has a thickness similar to that of said third conductive film.

14. A static random access memory as in claim 13, wherein said first conductive film has a first portion extending parallel to said third conductive film, said first interlayer insulating film having a substantially uniform first thickness and said second interlayer insulating film having said substantially uniform first thickness, wherein said first portion of said first conductive film is separated from said third conductive film by said first thickness.

15. A static random access memory, comprising:

a semiconductor substrate having a main surface;

a first conductive film, a first interlayer insulating film, a second conductive film, a second interlayer insulating film, a third conductive film, a third interlayer insulating film and a fourth conductive film consecutively formed overlying the main surface and each formed as a pattern;

bulk Metal Oxide Semiconductor Field Effect transistors (MOSFETs) each having a bulk active region on said main surface and a gate electrode comprising a portion of said first conductive film; and thin film MOSFETs each having a gate electrode comprising a portion of said third conductive film and a thin film active region comprising a portion of said fourth conductive film, said second conductive film and said first interlayer insulating film being patterned such that said first interlayer insulating film is substantially removed from substantially all regions other than regions where said second conductive film remains, wherein said second interlayer insulating film has a thickness similar to that of said third conductive film.

16. A static random access memory as in claim 15, wherein said first conductive film has a first portion extending parallel to said third conductive film, said first interlayer insulating film having a substantially uniform first thickness and said second interlayer insulating film having said substantially uniform first thickness, wherein said first portion of said first conductive film is separated from said third conductive film by said first thickness.

17. A static random access memory, comprising:

a semiconductor substrate having a main surface;

a first conductive film, a first interlayer insulating film, a second conductive film, a second interlayer insulating film, a third conductive film, a third interlayer insulating film and a fourth conductive film consecutively formed overlying the main surface;

bulk Metal Oxide Semiconductor Field Effect transistors (MOSFETs) each having a bulk active region on said main surface and a gate electrode comprising a portion of said first conductive film; and thin film MOSFETs each having a gate electrode comprising a portion of said third conductive film and a thin film active region comprising a portion of said fourth conductive film, said first conductive film having a first portion extending parallel to said third conductive film, said first portion and said third conductive film being separated only by said second interlayer insulating film, wherein said second interlayer insulating film has a thickness above approximately 50 nm and said third conductive film has a thickness similar to that of said second interlayer insulating film.

* * * * *